United States Patent [19]

Molenaar et al.

[11] 4,426,442

[45] Jan. 17, 1984

[54] METHOD OF PRODUCING METAL IMAGES OR PATTERNS ON AND/OR BELOW THE SURFACE OF A SUBSTRATE COMPRISING A SEMICONDUCTING LIGHT-SENSITIVE COMPOUND

[75] Inventors: Arian Molenaar; Peter E. Wierenga, both of Eindhoven, Netherlands

[73] Assignee: U.S. Philips Corporation, New York, N.Y.

[21] Appl. No.: 441,580

[22] Filed: Nov. 15, 1982

[30] Foreign Application Priority Data

Dec. 15, 1981 [NL] Netherlands ................. 8105633

[51] Int. Cl.³ ............... G03C 5/04; G03C 5/24
[52] U.S. Cl. .................... 430/413; 430/414; 430/417; 430/422; 430/945
[58] Field of Search .............. 430/1, 2, 346, 414, 430/413, 417, 945, 422

[56] References Cited

U.S. PATENT DOCUMENTS

| | | | |
|---|---|---|---|
| 3,052,541 | 9/1962 | Levinos | 430/346 |
| 3,380,823 | 4/1968 | Gold | 430/413 |
| 3,672,744 | 6/1972 | Strope et al. | 430/1 |
| 3,674,485 | 7/1972 | Jonker et al. | 430/417 |

*Primary Examiner*—Mary F. Downey
*Attorney, Agent, or Firm*—Paul R. Miller

[57] ABSTRACT

Producing metal images or patterns on and/or below the surface of a substrate material comprising a semiconducting light-sensitive compound, such as titanium dioxide or zinc oxide which after exposure of a metal compound releases this metal in the form of nuclei. Exposure takes place in the solution of the metal compound by means of a moving beam of laser light whereby the nuclei pattern is directly "written". Thereafter, the nuclei image is intensified in known manner to produce a visible image or a conductive pattern, for example by means of an electroless plating solution. Use: the recording of information as well as the production of printed circuit boards.

8 Claims, No Drawings

METHOD OF PRODUCING METAL IMAGES OR PATTERNS ON AND/OR BELOW THE SURFACE OF A SUBSTRATE COMPRISING A SEMICONDUCTING LIGHT-SENSITIVE COMPOUND

The invention relates to a method of producing metal images or patterns on and/or below the surface of a substrate which comprises a semiconducting, light-sensitive compound or which consists of that compound, the semiconducting compound being capable after having been exposed to light to deposit from a metal ion solution this metal in the form of nuclei which are intensified by means of physical development or with the aid of an electroless plating solution, and to the products obtained by means of this method.

U.S. Pat. No. 3,380,823 discloses such a method of producing images on a medium consisting of a paper support provided with a layer of a semiconducting pigment in a polymeric resinous binder. After exposure to light through a negative of an image whereby the pigment is reversibly activated, the medium is contacted with an image-forming reduction-oxidation system as a result of which the image is irreversibly formed.

A corresponding method of producing electrically conductive metal patterns on an insulating, polymeric substrate material, such as printed circuit boards, is described in U.S. Pat. No. 3,674,485, which method is also based on substrate material whose surface is provided with a layer consisting of a uniform dispersion of a light-sensitive, semiconductive metal compound in a hydrophobic, resinous binder. After the formation of a pattern of metal nuclei by selective exposure and contact with a solution of the relevant ions of the metal, the image consisting of metal nuclei is intesified by the use of a physical developer or an electroless plating solution to form an electrically conductive pattern.

These methods require the use of a screen pattern or, as the case may be, a negative. Additional measures such as the use of a means to prevent fogging are necessary to maintain the selectivity during the formation of the nuclear image and its intensification.

The invented method renders these means and the use of a protective pattern superfluous and considerably simplifies the formation of the image or, as the case may be, the pattern.

According to the invention, the method is characterized in that the surface in which or on which the light-sensitive semiconducting metal compound is provided is immersed in a solution containing ions of a nuclei-forming metal and which is exposed in accordance with a pattern by means of a focussed beam of laser light which moves in a controlled manner relative to the substrate and has such a wavelength in the ultra-violet or visible portion of the spectrum that it is absorbed by the relevant semiconducting compound.

Firstly, from such a solution the metal nuclei are photochemically deposited on the surface portion in which the semiconducting compound is contained and on which the laser beam is incident. Thereafter, without further exposure, the image metal can be deposited onto this catalytic nuclear image by means of an electroless deposition method, without further exposure. In that case the substrate need not be kept immersed in the same bath.

The exposure can be effected by moving the light beam by means of known programming techniques in accordance with the desired pattern.

In accordance with a further embodiment of the invented method exposure is effected in a solution of a metal salt and a reducing agent for that metal salt, which is suitable for electroless plating or for physical development.

It should be noted that the Japanese published patent application No. 75/92,830, an abstract of which was published in Chem. Abstr. 84, 9424On (1976), describes a method of applying gold patterns onto a Ga-As-surface. However, this is done by the use of a $CO_2$-laser which predominantly produces radiation having a wavelength of 10 $\mu$m. In this wavelength range photochemical processes such as those in accordance with the invention are of course impossible. The metal deposition described in these publications must be the result of thermal effects.

In order to make working with a method possible, using radiation by a controlled light beam which moves relative to the substrate in accordance with the pattern to be formed, instead of using a protective pattern, the formation of nuclei must be effected sufficiently rapidly. For that purpose the semiconducting metal compound used in the method in accordance with the invention must be sufficiently sensitive to light to enable very short exposure times in combination with the used intensity of the laser beam. Furthermore, the solution in which the surface is immersed must have a sufficiently high transmission for the light used.

A choice of the semiconducting metal oxide which is very suitable within the scope of the invention is titanium dioxide or zincoxide.

In view of the requirement that the solution of the ions of the nuclear image metal must have the highest possible transmission for the light used, the use of a solution from which electroless gold or gold alloy can be deposited for the formation of the nuclei and the subsequent intensification thereof is very interesting. These solutions which are known from the Netherlands patent application 8,103,174 and the United Kingdom patent specification 1,322,203 have in the wavelength range suitable for the photosensitive semiconductors a much higher transmission value than, for example, electroless copper plating solutions, the last-mentioned solutions only being suitable for use within the framework of the invention at comparatively low concentrations or with a shorter light path through the solution.

Some embodiments of the invention will now be described with reference to the following Examples.

EXAMPLE 1

Substrate material consisting of glass fibre-reinforced epoxy resin in which a quantity of approximately 4% by weight of titanium dioxide particles (rutile) had been dispersed were rendered hydrophilic by treating it successively during 6 min. with a methyl ethyl ketone-water-mixture (1:2) and, at 50° C. and while exposing it during 4 min. to vibrations having a frequency of 50 Hz, with a solution containing per liter 120 g $Na_2Cr_2O_7$,
400 ml $H_2SO_4$ (d=1.84) and
200 ml $H_3PO_4$ (d=1.88) and water.

Thereafter, the substrate material after having been rinsed in water was placed in a quartz cuvette containing an aqueous solution having a temperature of 50° C. and the following composition per liter:

0.04 mole copper sulphate
0.072 mole tetra-Na-salt of ethylene diamine tetra acetic acid
0.12 mole NaOH
0.10 mole formaldehyde.

Thereafter, the substrate material was exposed in the solution to a focused beam of a pulsed nitrogen laser. The power of the laser was 1 MW, the wavelength 337 nm, the pulse duration 4 ns and the pulse frequency 10 Hz. The light path through the solution was kept minimal. A distinct image was obtained with an effective exposure time of $12.10^{-8}$ sec and after intensifying for 10 minutes.

A comparable result was obtained with epoxy-glass fibre material in which ZnO powder had been dispersed.

EXAMPLE 2

Substrate material filled with titanium dioxide was placed after the same pre-treatment steps in an aqueous solution which was heated to 50° C. and contained per liter:

0.072 mole tetra-Na-salt of ethylene diamine-tetra-acetic acid
0.12 mole NaOH
0.014 mole potassium gold (I) cyanide.

The sheet material was exposed to the same pulsed nitrogen laser as used in Example 1. One pulse having an effective exposure time of $4.10^{-9}$ sec was sufficient to produce a clearly visible image.

EXAMPLE 3

A plate filled with titanium dioxide pigment in accordance with Example 1 and which had been made hydrophilic, was placed in an electroless copper plating solution in accordance with Example 1, and continuously exposed to an argon-ion laser (power approximately 0.70 W, wavelengths 334, 351 and 364 nm) for 16 seconds. During exposure the plate was displaced linearly over a distance of approximately 7 mm. After a stay of approximately 10 minutes in the solution after exposure a good electrically conducting copper line was obtained.

EXAMPLE 4

A plate filled with $TiO_2$ pigment and pre-treated in accordance with Example 1 was placed in an aqueous solution which contained per liter:

$5.6 \times 10^{-3}$ mole $PdCl_2$,
0.12 mole HCl and
0.4 wt.% "Tensagex DP 24", i.e. a wetting agent consisting of an alkyl aryl polyglycol ether sulphate.

A range of exposure was effected on the plate for 1, ½, ¼, ⅛, 1/16, 1/32 and 1/64 sec using the argon-ion laser of Example 3 (power approximately 0.70 W). After a stay of approximately 1 minute in a copper-plating solution which had been heated to 50° C. a block image was obtained in the exposed plates at all exposure values.

EXAMPLE 5

A plate consisting of $Al_2O_3$-ceramic was immersed in and thereafter gradually withdrawn from a solution consisting of 25 wt.% of titanium acetylacetonate and 75 wt.% of propanol-2. After having been dried with the aid of a hair dryer, the plate was maintained for 8 minutes at 500° C., titanium dioxide then being formed on the $Al_2O_3$-substrate by pyrolysis. Thereafter the plate was placed in a cuvette containing an aqueous solution which contained per liter:

0.014 mole potassium gold (I) cyanide
0.005 mole copper sulphate
0.072 mole tetra-Na-salt of ethylene diamine tetra acetic acid
0.12 mole NaOH and
0.13 mole formaldehyde.

The plate was exposed with the same range of exposure times as in Example 4. After having been kept for 15 minutes in the solution after exposure properly visible metal images had been formed.

What is claimed is:

1. A method of producing metal images or patterns on and/or below the surface of a substrate material wherein or whereon there is a semiconducting, light-sensitive compound or which consists of that compound, the semiconducting compound being capable after having been exposed to light to deposit from a metal ion solution this metal in the form of nuclei which are intensified by means of physical development or with the aid of an electroless plating solution, characterized in that the surface in which or on which the light-sensitive compound is provided is immersed in a solution containing ions of a nuclei forming metal and is exposed in accordance with a pattern by means of a focused beam of laser light which moves in a controlled manner relative to the substrate and has such a wavelength in the ultra-violet or visible portion of the spectrum that it is absorbed by the relevant semiconducting compound.

2. A method as claimed in claim 1, characterized in that exposure is effected in a solution of a metal salt and a reducing agent for that metal salt which is suitable for electroless plating or for physical development.

3. A method as claimed in claim 2, characterized in that the semiconducting, light-sensitive compound consists of titanium dioxide or zinc oxide.

4. A method as claimed in claim 3, characterized in that for forming the nuclei and the subsequent intensification thereof an electroless solution for the deposition of gold or a gold-copper alloy is used.

5. Products obtained by means of the method as claimed in claim 1.

6. A method as claimed in claim 2, characterized in that for forming the nuclei and the subsequent intensification thereof an electroless solution for the deposition of gold or a gold-copper alloy is used.

7. A method as claimed in claim 1, characterized in that the semiconducting, light-sensitive compound consists of titanium dioxide or zinc oxide.

8. A method as claimed in claim 1, characterized in that for forming the nuclei and the subsequent intensification thereof an electroless solution for the deposition of gold or a gold-copper alloy is used.

* * * * *